US011489039B2

(12) United States Patent
Chen

(10) Patent No.: US 11,489,039 B2
(45) Date of Patent: Nov. 1, 2022

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); TSMC CHINA COMPANY LIMITED, Shanghai (CN)

(72) Inventor: Zheng-Long Chen, New Taipei (TW)

(73) Assignees: TAIWAN SEMICONDUCTOR MANUFACTURING CO., LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 9 days.

(21) Appl. No.: 16/908,165

(22) Filed: Jun. 22, 2020

(65) Prior Publication Data

US 2021/0351268 A1    Nov. 11, 2021

(30) Foreign Application Priority Data

May 11, 2020    (CN) .......................... 202010392643.0

(51) Int. Cl.
*H01L 49/02* (2006.01)
*H01L 21/768* (2006.01)
*H01L 23/522* (2006.01)

(52) U.S. Cl.
CPC ........ *H01L 28/87* (2013.01); *H01L 21/76838* (2013.01); *H01L 23/5223* (2013.01); *H01L 2221/1068* (2013.01)

(58) Field of Classification Search
CPC ................. H01L 28/87; H01L 23/5223; H01L 21/76838; H01L 2221/1068
See application file for complete search history.

(56) References Cited

U.S. PATENT DOCUMENTS

| 6,094,339 A * | 7/2000 | Evans ...................... H01G 9/04 361/508 |
| 6,661,079 B1 * | 12/2003 | Bikulcius ............ H01L 23/5223 257/531 |
| 7,259,956 B2 * | 8/2007 | Fong .................... H01L 23/5223 361/301.1 |
| 7,538,006 B1 * | 5/2009 | Anderson .............. H01G 4/232 438/393 |
| 2007/0102788 A1 * | 5/2007 | Yang ....................... H01L 28/60 257/532 |
| 2007/0296013 A1 * | 12/2007 | Chang .................... H01L 28/60 257/306 |
| 2009/0091875 A1 | 4/2009 | Yeh et al. |
| 2019/0103422 A1 * | 4/2019 | Zhang ................. H01L 27/3244 |

FOREIGN PATENT DOCUMENTS

| CN | 107633128 A | 1/2018 |
| CN | 107785363 A | 3/2018 |
| TW | 200731307 A | 8/2007 |
| TW | 200917460 A | 4/2009 |

* cited by examiner

*Primary Examiner* — Ahmed N Sefer
(74) *Attorney, Agent, or Firm* — Maschoff Brennan

(57) ABSTRACT

A semiconductor device includes a capacitor. The capacitor includes a first electrode and a second electrode disposed in a first metal layer. The first electrode has a first end and a second end, and the first electrode has a spiral pattern extending outwards from the first end to the second end. The first electrode and the second electrode have a substantially equal spacing therebetween.

20 Claims, 13 Drawing Sheets

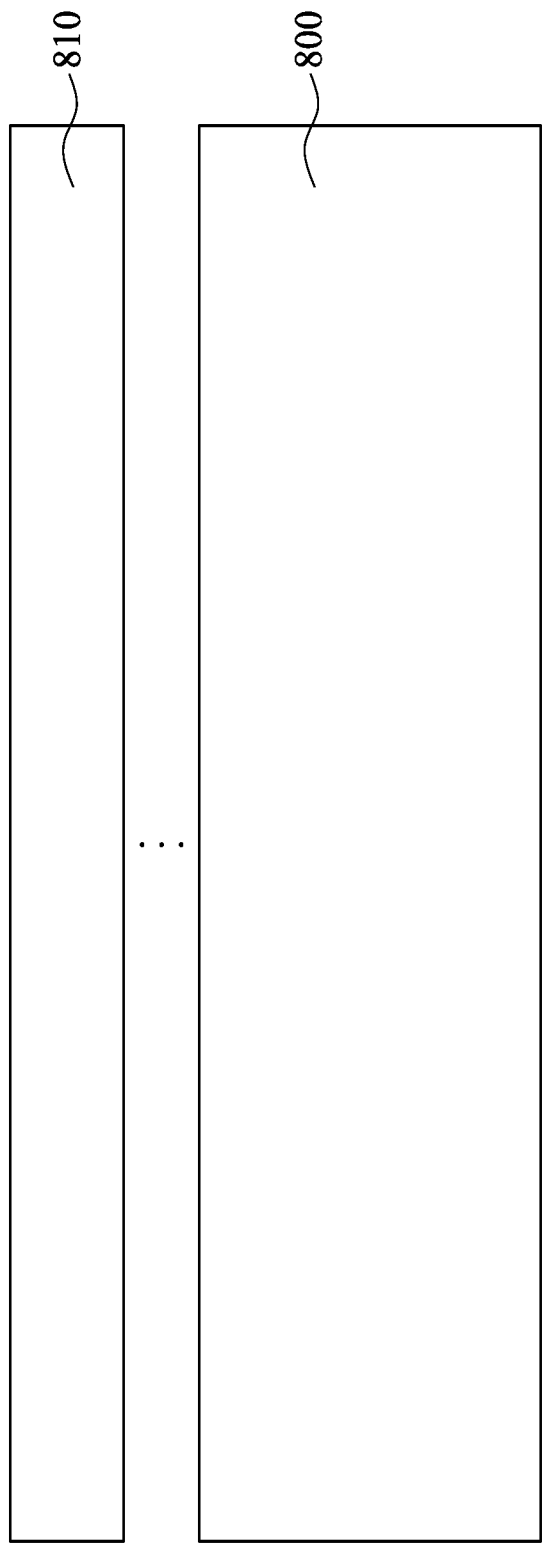

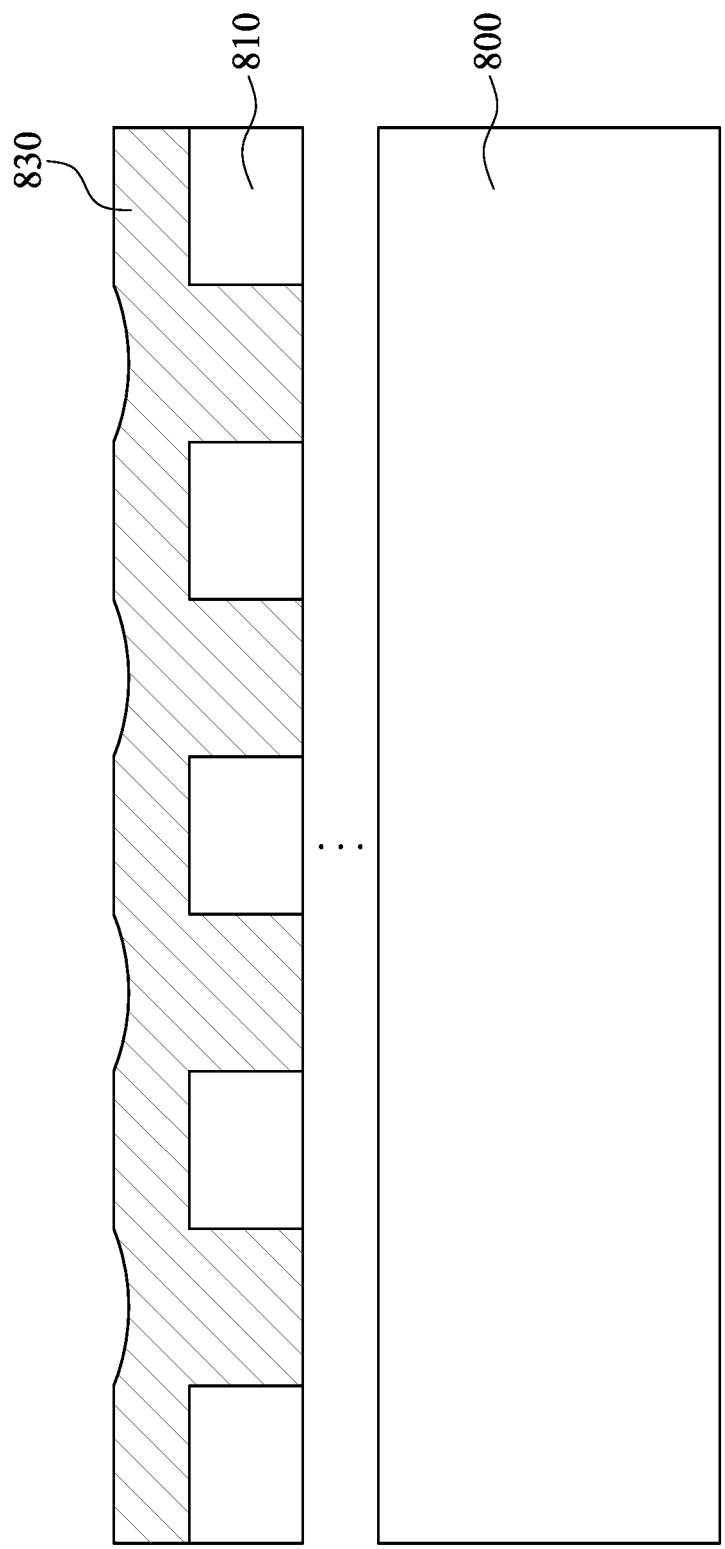

US 11,489,039 B2

SEMICONDUCTOR DEVICE AND MANUFACTURING METHOD THEREOF

CROSS-REFERENCE TO RELATED APPLICATION

This application claims priority to Chinese Application Serial Number 202010392643.0, filed May 11, 2020, which is herein incorporated by reference in its entirety.

BACKGROUND

Integrated chips are formed on semiconductor die including millions or billions of transistor devices. The transistor devices are configured to act as switches and/or to produce power gains so as to enable logical functionality for an integrated chip (e.g., form a processor configured to perform logic functions). Integrated chips often also include passive devices, such as capacitors, resistors, inductors, transistors, etc. Passive devices are widely used to control integrated chip characteristics (e.g., gain, time constants, etc.) and to provide an integrated chip with a wide range of different functionalities (e.g., manufacturing analog and digital circuitry on the same die).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A to 8F are cross-sectional views of the various stages of fabricating a semiconductor device according to some embodiments of the disclosure.

DETAILED DESCRIPTION

Figure 1:
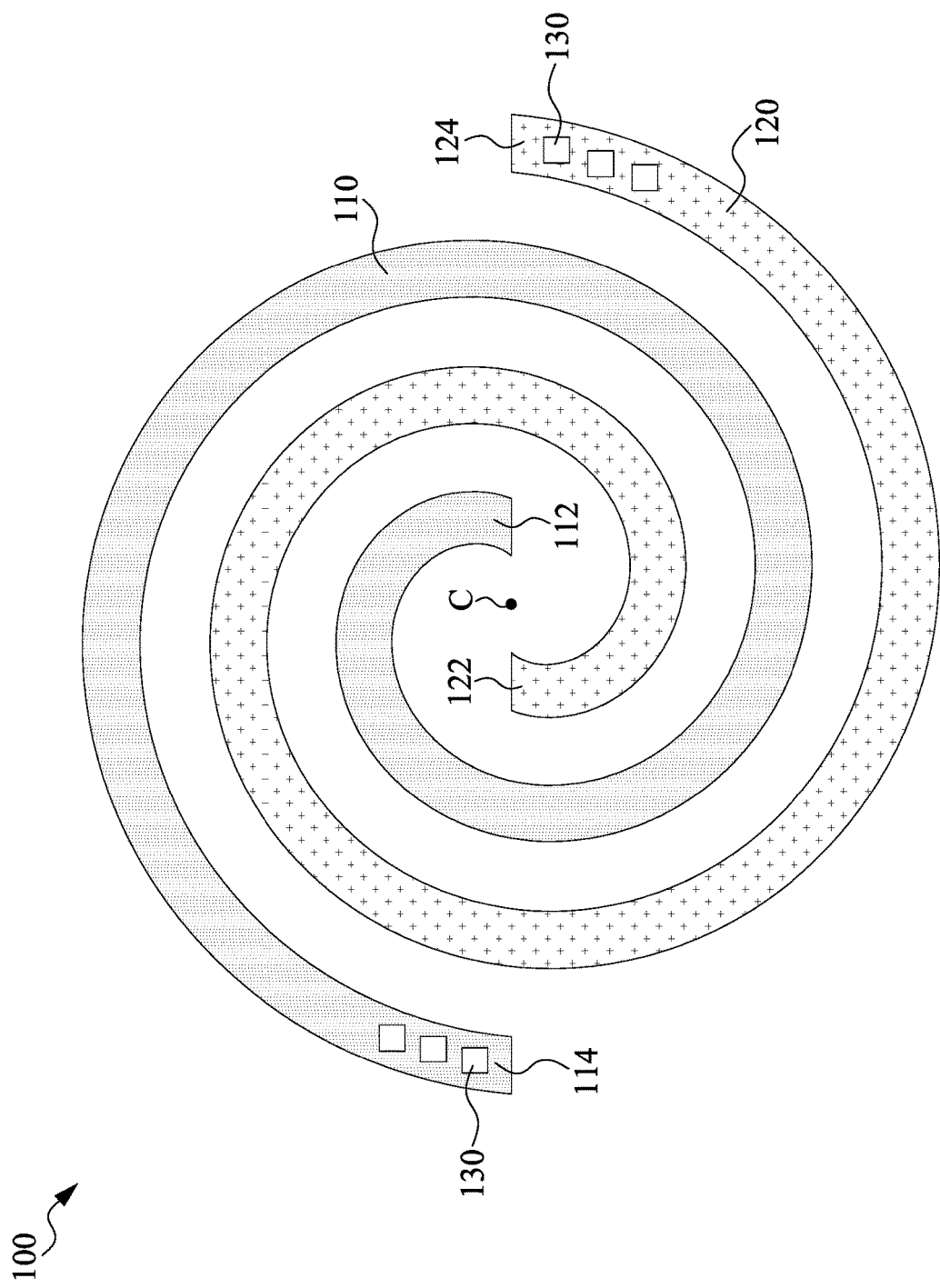
FIGS. 1-4 and 6 are plan views of semiconductor devices according to various embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Throughout the description, the term "MOM capacitor" is used to refer to a capacitor that has an insulator between two conductive plates, in which the insulator may include dielectric materials such as oxides. A single layer MOM capacitor may comprise a first metal plate, a second metal plate and an insulation layer deposited between the first metal plate and the second metal plate. The capacitance of the single layer MOM capacitor is proportional to the area of the metal plates and the dielectric constant of the insulation layer.

Reference is made to FIG. 1, which is a plan view of a semiconductor device according to some embodiments of the disclosure. The semiconductor device includes a capacitor 100, which includes a first electrode 110 and a second electrode 120, in which the first electrode 110 and the second electrode 120 are disposed in a plane, such as in the same metal layer. Dielectric material (not shown) is filled between the first electrode 110 and the second electrode 120. In some embodiments, the capacitor 100 may extend into other layers (e.g., interconnected by conductive vias). The capacitor 100 of FIG. 1 may be repeated in other layers above and/or below the given layer shown in FIG. 1. Accordingly, the first electrode 110 and the second electrode 120 may be repeated in multiple metal layers, and the electrodes in different metal layers are interconnected.

The capacitor 100 is a double surround structure. The first electrode 110 and the second electrode 120 are not directly connected to each other, and the first electrode 110 and the second electrode 120 surround each other from a center C of the capacitor 100 to an outer portion of the capacitor 100. For example, the capacitor 100 can be a double spiral structure, in which the first electrode 110 and the second electrode 120 both are spiral patterns.

In some embodiments, the first electrode 110 has a first end 112 and a second end 114. The first end 112 is substantially located adjacent the center C of the capacitor 100, and the first electrode 110 spirally extends outwards from the first end 112 to the second end 114. The first electrode 110 is a continuous line and does not have any branch between the first end 112 and the second end 114. In some embodiments, the first electrode 110 includes a plurality of curve portions, and the curve portions are connected to each other. The width of the first electrode 110 is uniform from the first end 112 to the second end 114. The first electrode 110 may include any suitable conductive material. In some embodiments, the first electrode 110 may include polysilicon. In some other embodiments, the first electrode 110 may include metal.

In some embodiments, the second electrode 120 has a first end 122 and a second end 124. The first end 122 of the second electrode 120 is substantially located adjacent the center C of the capacitor 100, and the second electrode 120 spirally extends outwards from the first end 122 to the second end 124. The second electrode 120 is a continuous line and does not have any branch between the first end 122 and the second end 124. In some embodiments, the second electrode 120 includes a plurality of curve portions, and the curve portions are connected to each other. The width of the second electrode 120 is uniform from the first end 122 to the second end 124. The second electrode 120 may include any suitable conductive material. In some embodiments, the second electrode 120 may include polysilicon. In some other embodiments, the second electrode 120 may include metal.

In some embodiments, the first electrode 110 and the second electrode 120 have a substantially equal spacing therebetween. The first electrode 110 is substantially equally spaced from the second electrode 120. The space can be regarded as the distance between the first electrode 110 and the second electrode 120. Alternatively, the space can be regarded as the width of the dielectric material between the first electrode 110 and the second electrode 120. The size of the space between the first electrode 110 and the second electrode 120 is designed depending on the capacitor breakdown voltage requirement.

In some embodiments, the double spiral structure including the first electrode 110 and the second electrode 120 is a multi-turns structure. That is, the angle from the first end 112 of the first electrode 110 to the second end 114 of the first electrode 110 is greater than about 720 degrees, and the angle from the first end 122 of the second electrode 120 to the second end 124 of the second electrode 120 is greater than about 720 degrees.

The first electrode 110 and the second electrode 120 extend in the same direction. For example, the first electrode 110 and the second electrode 120 both extend counterclockwise or clockwise from the center C of the capacitor 100. For better space utilization, the first end 112 of the first electrode 110 and the second end 114 of the first electrode 110 face the same direction, and the first end 122 of the second electrode 120 and the second end 124 of the second electrode 120 face the same direction. Moreover, the first end 112 of the first electrode 110 and the first end 122 of the second electrode 120 do not face the same direction, and the second end 114 of the first electrode 110 and the second end 124 of the second electrode 120 do not face the same direction. In some embodiments, the first end 112 of the first electrode 110 and the first end 122 of the second electrode 120 face opposite directions. In some embodiments, the second end 114 of the first electrode 110 and the second end 124 of the second electrode 120 face opposite directions.

In some embodiments, the spiral pattern of the first electrode 110 and the second electrode 120 is a spiral of Archimedes. The first electrode 110 and the second electrode 120 can be connected to power lines or other metal layers through vias 130. In some embodiments, the vias 130 are disposed adjacent the second ends 114, 124 of the first and second electrodes 110, 120.

The capacitor 100 as shown in FIG. 1 can increase the effective area within the same layout area, thereby resulting in a larger capacitance value with the same layout area. The pattern of the double surround capacitor is not limited to the spiral pattern, and other suitable patterns can be utilized in the double surround capacitor. Variations of the double surround capacitor are discussed in the following embodiments.

Figure 2:
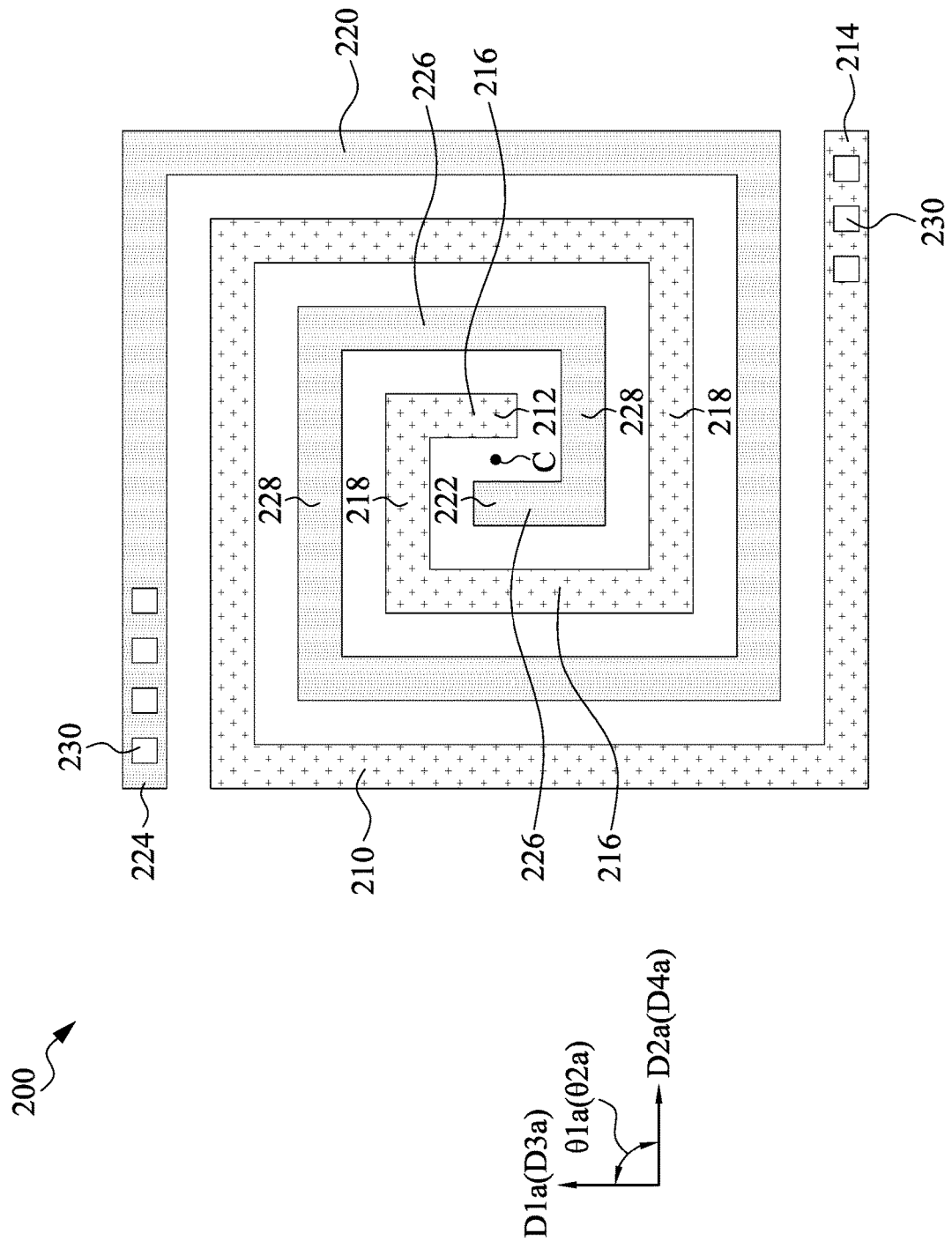

Reference is made to FIG. 2, which is a plan view of an integrated circuit having a semiconductor device according to some embodiments of the disclosure. In some embodiments, the capacitor 200 of the semiconductor device is a quadrilateral double surround structure. The capacitor 200 includes a first electrode 210 and a second electrode 220. The first electrode 210 and the second electrode 220 are disposed in a plane, such as in the same metal layer. The first electrode 210 and the second electrode 220 are not directly connected to each other, and the first electrode 210 and the second electrode 220 surround each other and extend from a center C of the capacitor 200 to an outer portion of the capacitor 200.

The first electrode 210 of the capacitor 200 includes a plurality of turns. The first electrode 210 extends outwards from a first end 212 to a second end 214, in which the first end 212 of the first electrode 210 is disposed adjacent the center C of the capacitor 200. The first electrode 210 is a continuous line and does not have any branch between the first end 212 and the second end 214. The first electrode 210 includes a plurality of first portions 216 and a plurality of second portions 218. The first portions 216 and the second portions 218 are coplanarly arranged. The first portions 216 and the second portions 218 are alternately arranged and connected to each other from the first end 212 to the second end 214 of the first electrode 210. Each of the first portions 216 extends longitudinally in a first direction D1$a$. The first portions 216 are substantially parallel to each other. Each of the second portions 218 extends from the adjacent first portion 216 in a second direction D2$a$, in which the second direction D2$a$ is non co-linear with the first direction D1$a$. The second portions 218 are substantially parallel to each other.

In some embodiments, the lengths of the first portions 216 are not the same. In some embodiments, the lengths of the first portions 216 are gradually increased from the center C of the capacitor 200. For example, the first portion 216 adjacent the center C has the first end 212 and has the shortest length among the first portions 216. Similarly, the lengths of the second portions 218 are not the same. In some embodiments, the lengths of the second portions 218 are gradually increased from the center C of the capacitor 200. For example, the second portion 218 farthest away from the center C has the second end 214 and has the longest length among the second portions 218.

The second electrode 220 of the capacitor 200 includes a plurality of turns. The second electrode 220 extends outwards from a first end 222 to a second end 224, in which the first end 222 of the second electrode 220 is disposed adjacent the center C of the capacitor 200. The second electrode 220 is a continuous line and does not have any branch between the first end 222 and the second end 224. The second electrode 220 includes a plurality of first portions 226 and a plurality of second portions 228. The first portions 226 and the second portions 228 are coplanarly arranged. The first portions 226 and the second portions 228 are alternately arranged and connected to each other from the first end 222 to the second end 224 of the second electrode 220. Each of the first portions 226 extends longitudinally in the third direction D3$a$. The first portions 226 are substantially parallel to each other. Each of the second portions 228 extends from the adjacent first portion 226 in a fourth direction D4$a$, in which the fourth direction D4$a$ is non co-linear with the third direction D3$a$. The second portions 228 are substantially parallel to each other.

In some embodiments, the first direction D1$a$ is substantially parallel to the third direction D3$a$, and the second direction D2$a$ is substantially parallel to the fourth direction D4$a$. In some embodiments, an angle $\theta 1a$ between the first direction D1$a$ and the second direction D2$a$ is greater than or approximately equal to 90 degrees, and an angle between each of the first portions 216 and each of the second portions 218 is greater than or approximately equal to 90 degrees. In some embodiments, an angle $\theta 2a$ between the third direction D3$a$ and the fourth direction D4$a$ is greater than or approximately equal to 90 degrees, and an angle between each of the first portions 226 and each of the second portions 228 is greater than or approximately equal to 90 degrees.

In some embodiments, the first portions 226 of the second electrode 220 are substantially parallel to the first portions 216 of the first electrode 210, and the second portions 228 of the second electrode 220 are substantially parallel to the second portions 218 of the first electrode 210.

In some embodiments, the lengths of the first portions 226 are not the same. In some embodiments, the lengths of the first portions 226 are gradually increased from the center C of the capacitor 200. For example, the first portion 226 adjacent the center C has the first end 222 and has the shortest length among the first portions 226. Similarly, the lengths of the second portions 228 are not the same. In some embodiments, the lengths of the second portions 228 are gradually increased from the center C of the capacitor 200. For example, the second portion 228 farthest away from the center C has the second end 224 and has the longest length among the second portions 228.

The first electrode 210 and the second electrode 220 can be connected to power lines or other metal layers through vias 230. In some embodiments, the vias 230 are disposed adjacent the second ends 214, 224 of the first and second electrodes 210, 220.

Figure 3:
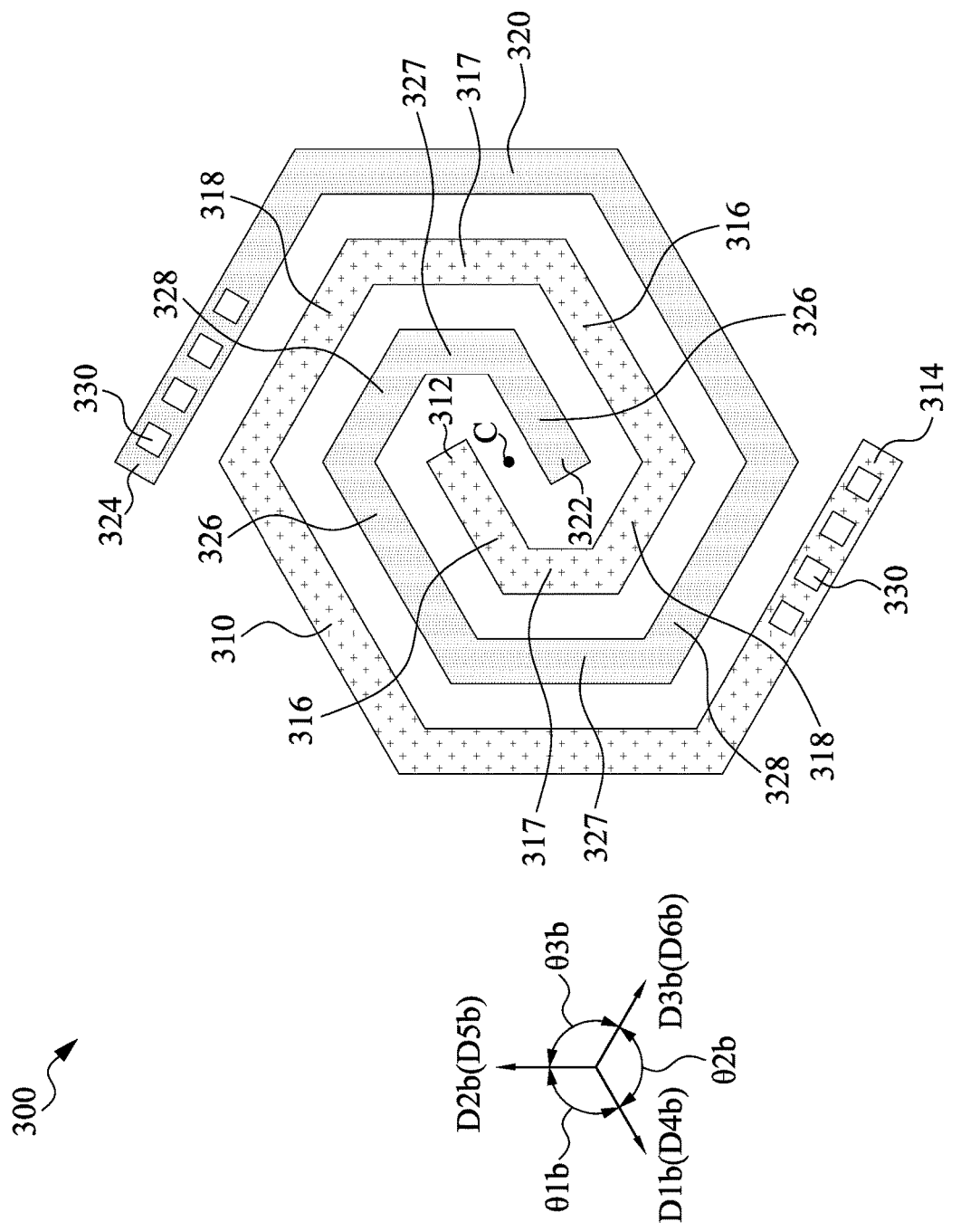

Reference is made to FIG. 3, which is a plan view of a semiconductor device according to some embodiments of the disclosure. In some embodiments, the capacitor 300 of the semiconductor device is a hexagonal double surround structure. The capacitor 300 includes a first electrode 310 and a second electrode 320. The first electrode 310 and the second electrode 320 are disposed in a plane, such as in the same metal layer. The first electrode 310 and the second electrode 320 are not directly connected to each other, and the first electrode 310 and the second electrode 320 surround each other and extend from a center C of the capacitor 300 to an outer portion of the capacitor 300.

The first electrode 310 of the capacitor 300 includes a plurality of turns. The first electrode 310 extends outwards from a first end 312 to a second end 314, in which the first end 312 of the first electrode 310 is disposed adjacent the center C of the capacitor 300. The first electrode 310 is a continuous line and does not have any branch between the first end 312 and the second end 314. The first electrode 310 includes a plurality of first portions 316, a plurality of second portions 317, and a plurality of third portions 318. The first portions 316, the second portions 317, and the third portions 318 are coplanarly arranged. The first portions 316, the second portions 317, and the third portions 318 are sequentially arranged and are connected to each other from the first end 312 to the second end 314 of the first electrode 310.

Each of the first portions 316 extends longitudinally in a first direction D1$b$. The first portions 316 are substantially parallel to each other. Each of the second portions 317 extends longitudinally in a second direction D2$b$. Each of the second portions 317 extends from the adjacent first portion 316 in the second direction D2$b$, in which the second direction D2$b$ is non co-linear with the first direction D1$b$. The second portions 317 are substantially parallel to each other.

Each of the third portions 318 extends longitudinally in a third direction D3$b$. The third portions 318 are substantially parallel to each other. Each of the third portions 318 extends from the adjacent second portion 317 in the third direction D3$b$, in which the third direction D3$b$ is non co-linear with the second direction D2$b$. The third portions 318 are substantially parallel to each other. Moreover, each of the first portions 316 extends from the adjacent third portion 318 in the first direction D1$b$, in which the first direction D1$b$ is non co-linear with the third direction D3$b$.

In some embodiments, the lengths of the first portions 316 are not the same. For example, the lengths of the first portions 316 are gradually increased from the center C of the capacitor 300. For example, the first portion 316 adjacent the center C has the first end 312 and has the shortest length among the first portions 316. The third portion 318 farthest away from the center C has the second end 314 and has the longest length among the third portions 318. Similarly, the lengths of the second portions 317 are not the same, and the lengths of the second portions 317 are gradually increased from the center C of the capacitor 300. For example, the second portion 317 closer to the center C has a shorter length than the second portion 317 away from the center C.

The second electrode 320 of the capacitor 300 includes a plurality of turns. The second electrode 320 extends outwards from a first end 322 to a second end 324, in which the first end 322 of the second electrode 320 is disposed adjacent the center C of the capacitor 300. The second electrode 320 is a continuous line and does not have any branch between the first end 322 and the second end 324. The second electrode 320 includes a plurality of first portions 326, a plurality of second portions 327, and a plurality of third portions 328. The first portions 326, the second portions 327, and the third portions 328 are coplanarly arranged. The first portions 326, the second portions 327, and the third portions 328 are sequentially arranged and connected to each other from the first end 322 to the second end 324 of the second electrode 320.

Each of the first portions 326 extends longitudinally in a fourth direction D4$b$. The first portions 326 are substantially parallel to each other. Each of the second portions 327 extends longitudinally in a fifth direction D5$b$. Each of the second portions 327 extends from the adjacent first portion 326 in the fifth direction D5$b$, in which the fifth direction D5$b$ is non co-linear with the fourth direction D4$b$. The second portions 327 are substantially parallel to each other.

Each of the third portions 328 extends longitudinally in a sixth direction D6$b$. The third portions 328 are substantially parallel to each other. Each of the third portions 328 extends from the adjacent second portion 327 in the sixth direction D6$b$, in which the sixth direction D6$b$ is non co-linear with the fifth direction D5$b$. The third portions 328 are substantially parallel to each other. Moreover, each of the first portions 326 extends from the adjacent third portion 328 in the fourth direction D4$b$, in which the fourth direction D4$b$ is non co-linear with the sixth direction D6$b$.

In some embodiments, the lengths of the first portions 326 are not the same. For example, the lengths of the first portions 326 are gradually increased from the center C of the capacitor 300. For example, the first portion 326 adjacent the center C has the first end 322 and has the shortest length among the first portions 326. The third portion 328 farthest away from the center C has the second end 314 and has the longest length among the third portions 328. Similarly, the lengths of the second portions 327 are not the same, and the lengths of the second portions 327 are gradually increased from the center C of the capacitor 300. For example, the second portion 327 closer to the center C has a shorter length than the second portion 327 away from the center C.

In some embodiments, the first direction D1$b$ is substantially parallel to the fourth direction D4$b$, the second direction D2$b$ is substantially parallel to the fifth direction D5$b$, and the third direction D3$b$ is substantially parallel to the sixth direction D6$b$. In some embodiments, an angle θ1$b$ between the first direction D1$b$ and the second direction D2$b$ is greater than or approximately equal to 120 degrees, and an angle between the first portions 316, 326 and the second portions 317, 327 is greater than or approximately equal to 120 degrees. In some embodiments, an angle θ2$b$ between the second direction D2*b* and the third direction D3*b* is greater than or approximately equal to 120 degrees, and an angle between the second portions 317, 327 and the third portions 318, 328 is greater than or approximately equal to 120 degrees. In some embodiments, an angle θ3*b* between the first direction D1*b* and the third direction D3*b* is greater than or approximately equal to 120 degrees, and an angle between the first portions 316, 326 and the third portions 318, 328 is greater than or approximately equal to 120 degrees.

For better space utilization, the first end 312 of the first electrode 310 and the second end 314 of the first electrode 310 do not face the same direction, and the first end 322 of the second electrode 320 and the second end 324 of the second electrode 320 do not face the same direction. Moreover, the first end 312 of the first electrode 310 and the first end 322 of the second electrode 320 do not face the same direction, and the second end 314 of the first electrode 310 and the second end 324 of the second electrode 320 do not face the same direction. In some embodiments, the first end 312 of the first electrode 310 and the first end 322 of the second electrode 320 face opposite directions. In some embodiments, the second end 314 of the first electrode 310 and the second end 324 of the second electrode 320 face opposite directions.

The first electrode 310 and the second electrode 320 can be connected to power lines or other metal layers through vias 330. In some embodiments, the vias 330 are disposed adjacent the second ends 314, 324 of the first and second electrodes 310, 320.

Figure 4:
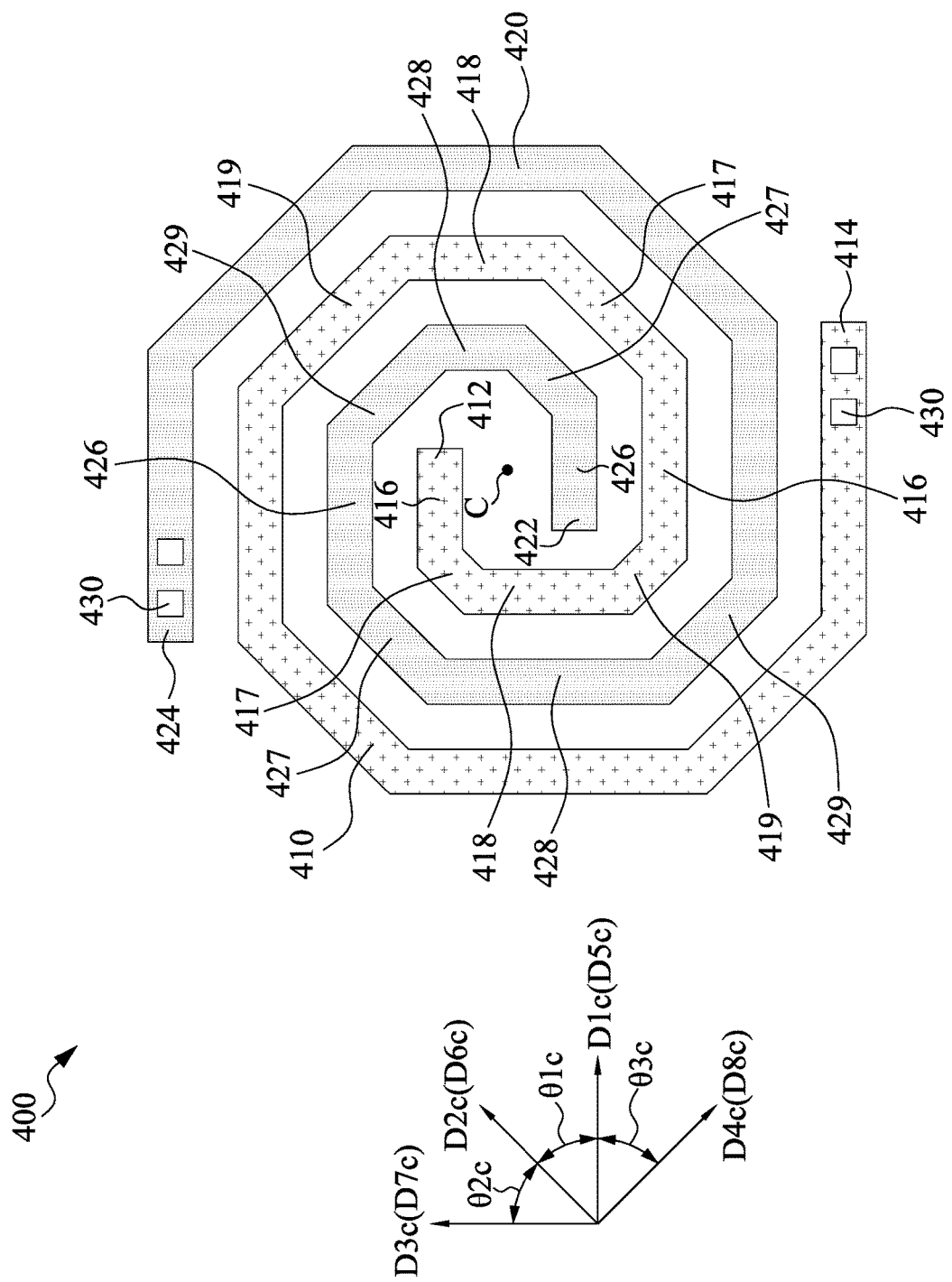

Reference is made to FIG. 4, which is a plan view of a semiconductor device according to some embodiments of the disclosure. In some embodiments, the capacitor 400 of the semiconductor device is an octagonal double surround structure. The capacitor 400 includes a first electrode 410 and a second electrode 420. The first electrode 410 and the second electrode 420 are disposed in a plane, such as in the same metal layer. The first electrode 410 and the second electrode 420 are not directly connected to each other, and the first electrode 410 and the second electrode 420 surround each other and extend from a center C of the capacitor 400 to an outer portion of the capacitor 400.

The first electrode 410 of the capacitor 400 includes a plurality of turns. The first electrode 410 extends outwards from a first end 412 to a second end 414, in which the first end 412 of the first electrode 410 is disposed adjacent the center C of the capacitor 400. The first electrode 410 is a continuous line and does not have any branch between the first end 412 and the second end 414. The first electrode 410 includes a plurality of first portions 416, a plurality of second portions 417, a plurality of third portions 418, and a plurality of fourth portions 419. The first portions 416, the second portions 417, the third portions 418, and the fourth portions 419 are coplanar arranged. The first portions 416, the second portions 417, the third portions 418, and the fourth portions 419 are sequentially arranged and are connected to each other from the first end 412 to the second end 414 of the first electrode 410.

Each of the first portions 416 extends longitudinally in a first direction D1*c*. The first portions 416 are substantially parallel to each other. Each of the second portions 417 extends longitudinally in a second direction D2*c*. Each of the second portions 417 extends from the adjacent first portion 416 in the second direction D2*c*, in which the second direction D2*c* is non co-linear with the first direction D1*c*. The second portions 417 are substantially parallel to each other.

Each of the third portions 418 extends longitudinally in a third direction D3*c*. The third portions 418 are substantially parallel to each other. Each of the third portions 418 extends from the adjacent second portion 417 in the third direction D3*c*, in which the third direction D3*c* is non co-linear with the second direction D2*c*. The third portions 418 are substantially parallel to each other.

Each of the fourth portions 419 extends longitudinally in a fourth direction D4*c*. The fourth portions 419 are substantially parallel to each other. Each of the fourth portions 419 extends from the adjacent third portion 418 in the fourth direction D4*c*, in which the fourth direction D4*c* is non co-linear with the third direction D3*c*. The fourth portions 419 are substantially parallel to each other. Moreover, each of the first portions 416 extends from the adjacent fourth portion 419 in the first direction D1*c*, in which the first direction D1*c* is non co-linear with the fourth direction D4*c*.

In some embodiments, the lengths of the first portions 416, the second portions 417, the third portions 418, and the fourth portions 419 are not the same and are gradually increased from the center C of the capacitor 400. For example, the first portion 416 adjacent the center C has the first end 412 and has the shortest length among the first portions 316. The first portion 416 farthest away from the center C has the second end 414 and has the longest length among the first portions 416.

The second electrode 420 of the capacitor 400 includes a plurality of turns. The second electrode 420 extends outwards from a first end 422 to a second end 424, in which the first end 422 of the second electrode 420 is disposed adjacent the center C of the capacitor 400. The second electrode 420 is a continuous line and does not have any branch between the first end 422 and the second end 424. The second electrode 420 includes a plurality of first portions 426, a plurality of second portions 427, a plurality of third portions 428, and a plurality of fourth portions 429. The first portions 426, the second portions 427, the third portions 428, and the fourth portions 429 are coplanar arranged. The first portions 426, the second portions 427, the third portions 428, and the fourth portions 429 are sequentially arranged and connected to each other from the first end 422 to the second end 424 of the second electrode 420.

Each of the first portions 426 extends longitudinally in a fifth direction D5*c*. The first portions 426 are substantially parallel to each other. Each of the second portions 427 extends longitudinally in a sixth direction D6*c*. Each of the second portions 427 extends from the adjacent first portion 426 in the sixth direction D6*c*, in which the sixth direction D6*c* is non co-linear with the fifth direction D5*c*. The second portions 427 are substantially parallel to each other.

Each of the third portions 428 extends longitudinally in a seventh direction D7*c*. The third portions 428 are substantially parallel to each other. Each of the third portions 428 extends from the adjacent second portion 427 in the seventh direction D7*c*, in which the seventh direction D7*c* is non co-linear with the sixth direction D6*c*. The third portions 428 are substantially parallel to each other.

Each of the fourth portions 429 extends longitudinally in an eighth direction D8*c*. The fourth portions 429 are substantially parallel to each other. Each of the fourth portions 429 extends from the adjacent third portion 428 in the eighth direction D8*c*, in which the eighth direction D8*c* is non co-linear with the seventh direction D7*c*. The fourth portions 429 are substantially parallel to each other. Moreover, each of the first portions 426 extends from the adjacent fourth portion 429 in the fifth direction D5*c*, in which the fifth direction D5*c* is non co-linear with the eighth direction D8*c*.

In some embodiments, the first direction D1c is substantially parallel to the fifth direction D5c, the second direction D2c is substantially parallel to the sixth direction D6c, the third direction D3c is substantially parallel to the seventh direction D7c, and the fourth direction D4c is substantially parallel to the eighth direction D8c. In some embodiments, an angle θ1c between the first direction D1c and the second direction D2c is greater than or approximately equal to 45 degrees, and an angle between the first portions 416, 426 and the second portions 417, 427 is greater than or approximately equal to 135 degrees. In some embodiments, an angle θ2c between the second direction D2c and the third direction D3c is greater than or approximately equal to 45 degrees, and an angle between the second portions 417, 427 and the third portions 418, 428 is greater than or approximately equal to 135 degrees. In some embodiments, an angle θ3c between the first direction D1c and the fourth direction D4c is greater than or approximately equal to 45 degrees, and an angle between the first portions 416, 426 and the fourth portions 419, 429 is greater than or approximately equal to 135 degrees.

In some embodiments, the lengths of the first portions 426, the second portions 427, the third portions 428, and the fourth portions 429 are not the same and are gradually increased from the center C of the capacitor 400. For example, the first portion 426 adjacent the center C has the first end 422 and has the shortest length among the first portions 426. The first portion 426 farthest away from the center C has the second end 424 and has the longest length among the first portions 426.

For better space utilization, the first end 412 of the first electrode 410 and the second end 414 of the first electrode 410 face the same direction, and the first end 422 of the second electrode 420 and the second end 424 of the second electrode 420 face the same direction. Moreover, the first end 412 of the first electrode 410 and the first end 422 of the second electrode 420 do not face the same direction, and the second end 414 of the first electrode 410 and the second end 424 of the second electrode 420 do not face the same direction. In some embodiments, the first end 412 of the first electrode 410 and the first end 422 of the second electrode 420 face opposite directions. In some embodiments, the second end 414 of the first electrode 410 and the second end 424 of the second electrode 420 face opposite directions.

The first electrode 410 and the second electrode 420 can be connected to power lines or other metal layers through vias 430. In some embodiments, the vias 430 are disposed adjacent the second ends 414, 424 of the first and second electrodes 410, 420.

Figure 5:
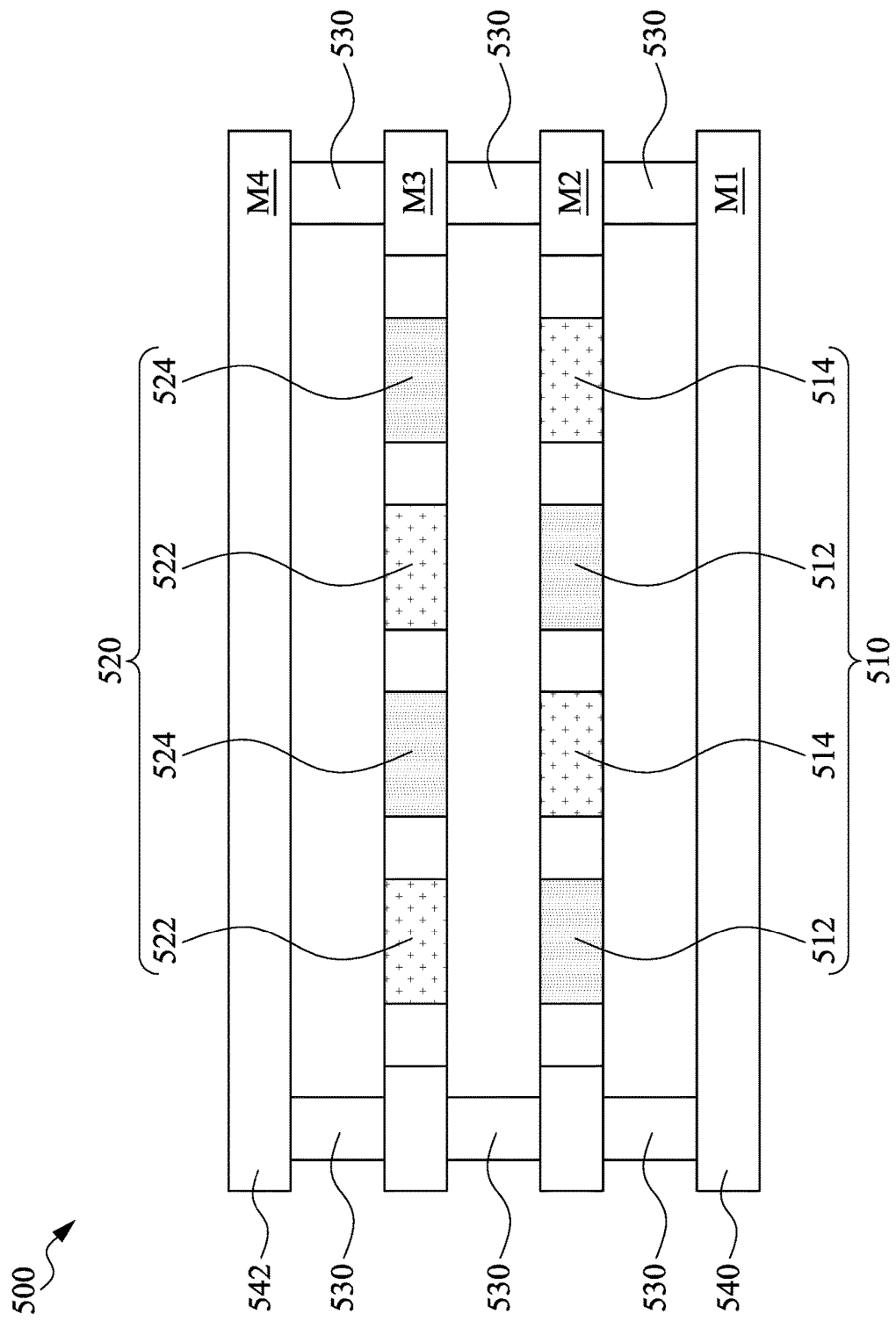
FIGS. 5 and 7 are cross-sectional views of semiconductor devices according to various embodiments of the disclosure.

Reference is made to FIG. 5, which is a cross-sectional view of a semiconductor device according to some embodiments of the disclosure. The semiconductor device 500 includes a plurality of metal layers. For example, the semiconductor device 500 includes a first metal layer M1, a second metal layer M2, a third metal layer M3, and a fourth metal layer M4. The second metal layer M2 and the third metal layer M3 are formed between the first metal layer M1 and the fourth metal layer M4 and have a first capacitor 510 and a second capacitor 520, respectively. The first metal layer M1 and the fourth metal layer M4 can be interconnected through vias 530.

In some embodiments, the first metal layer M1 includes a bottom metal plate 540, and the fourth metal layer M4 includes a top metal plate 542. The bottom metal plate 540 and the top metal plate 542 may serve as shield metal plates, and the first capacitor 510 and the second capacitor 520 are disposed between the bottom metal plate 540 and the top metal plate 542.

The first capacitor 510 and the second capacitor 520 can be a MOM capacitor, such as the capacitor 100, 200, 300, 400 discussed above. The first capacitor 510 is disposed in the second metal layer M2 and includes a first electrode 512 and a second electrode 514. The second capacitor 520 is disposed in the third metal layer M3 and includes a first electrode 522 and a second electrode 524.

In some embodiments, the first electrode 512 of the first capacitor 510 completely overlaps the first electrode 522 of the second capacitor 520, and the second electrode 514 of the first capacitor 510 completely overlaps the second electrode 524 of the second capacitor 520. In some embodiments, the first electrode 512 of the first capacitor 510 and the first electrode 522 of the second capacitor 520 are oppositely charged, and the second electrode 514 of the first capacitor 510 and the second electrode 524 of the second capacitor 520 are oppositely charged.

For example, the first electrode 512 is a cathode of the first capacitor 510, the second electrode 514 is an anode of the first capacitor 510, the first electrode 522 is an anode of the second capacitor 520, and the second electrode 524 is a cathode of the second capacitor 520. By such an arrangement, the capacitance is not only laterally introduced between the first electrode 512 and the second electrode 514 of the first capacitor 510 and between the first electrode 522 and the second electrode 524 of the second capacitor 520, but also vertically introduced between the first electrode 512 of the first capacitor 510 and the first electrode 522 of the second capacitor 520 and the second electrode 514 of the first capacitor 510 and the second electrode 524 of the second capacitor 520, such that the capacitance value of the semiconductor device 500 can be further increased.

Figure 6:
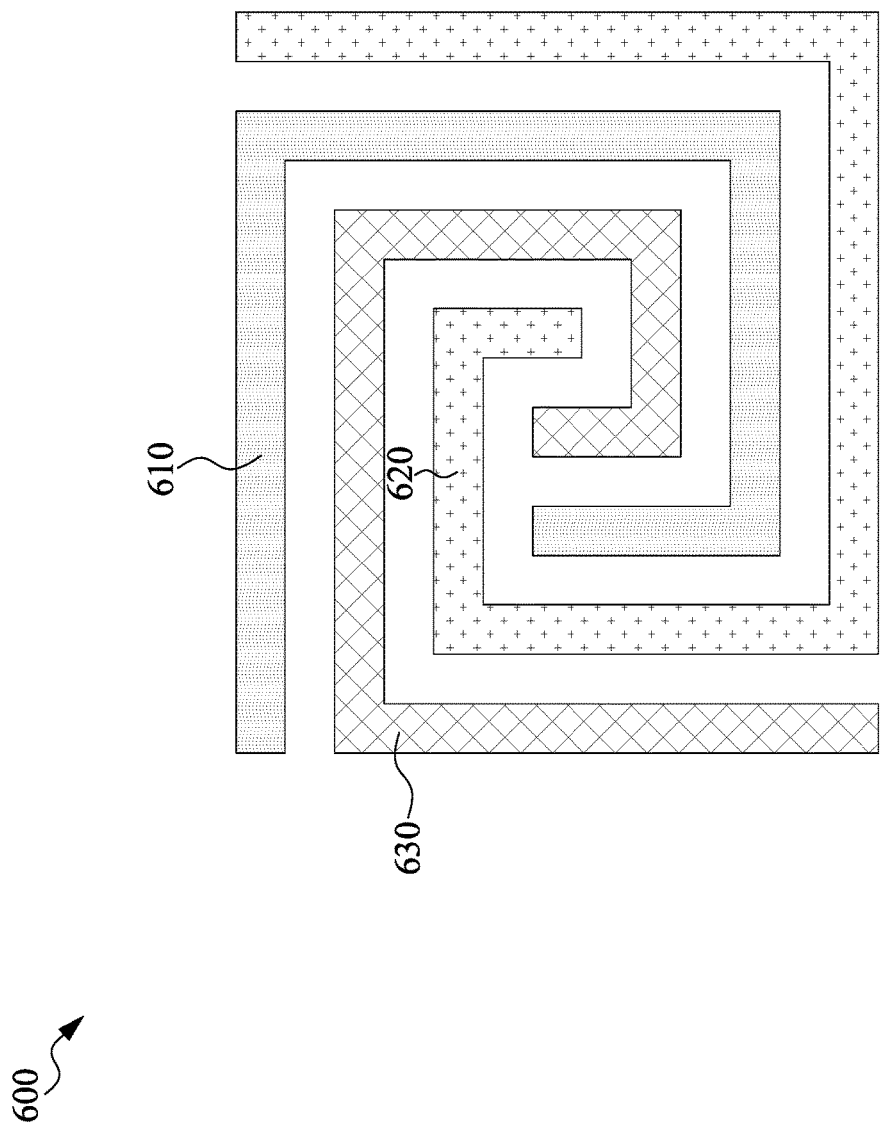

Reference is made to FIG. 6, which is a plan view of a semiconductor device according to some embodiments of the disclosure. The semiconductor device 600 includes a first capacitor C1 and a second capacitor C2, in which the first capacitor C1 and the second capacitor C2 are disposed in a plane, such as the same metal layer. In some embodiments, the first capacitor C1 and the second capacitor C2 are quadrilateral double surround structures. In some other embodiments, the first capacitor C1 and the second capacitor C2 can be spiral double surround structures, hexagonal double surround structures, octagonal double surround structures, or other polygonal double surround structures.

The semiconductor device 600 includes a first electrode 610 of the first capacitor C1, a second electrode 620 of the second capacitor C2, and a common electrode 630 shared by the first capacitor C1 and the second capacitor C2. The common electrode 630 is disposed between the first electrode 610 of the first capacitor C1 and the second electrode 620 of the second capacitor C2. The common electrode 630 and the first electrode 610 form the first capacitor C1, and the common electrode 630 and the second electrode 620 form the second capacitor C2. In some embodiments, the first electrode 610 is an anode of the first capacitor C1, the second electrode 620 is an anode of the second capacitor C2, and the common electrode 630 is a common cathode of the first capacitor C1 and the second capacitor C2. In some other embodiments, the first electrode 610 is a cathode of the first capacitor C1, the second electrode 620 is a cathode of the second capacitor C2, and the common electrode 630 is a common anode of the first capacitor C1 and the second capacitor C2.

Figure 7:
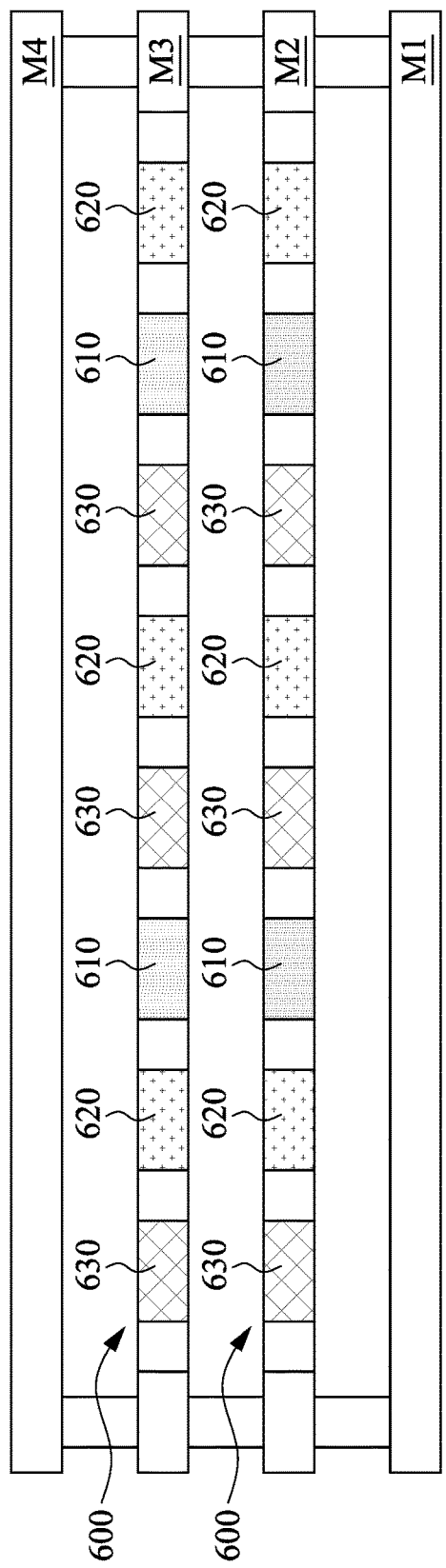

In some embodiments, the structure of FIG. 6 can be stacked on an identical or similar structure, as illustrated in FIG. 7, such that the capacitance can be laterally introduced between the first capacitor C1 and the second capacitor C2 in the plane and vertically introduced between the first capacitor C1 and the second capacitor C2 in different planes.

Figure 8B:
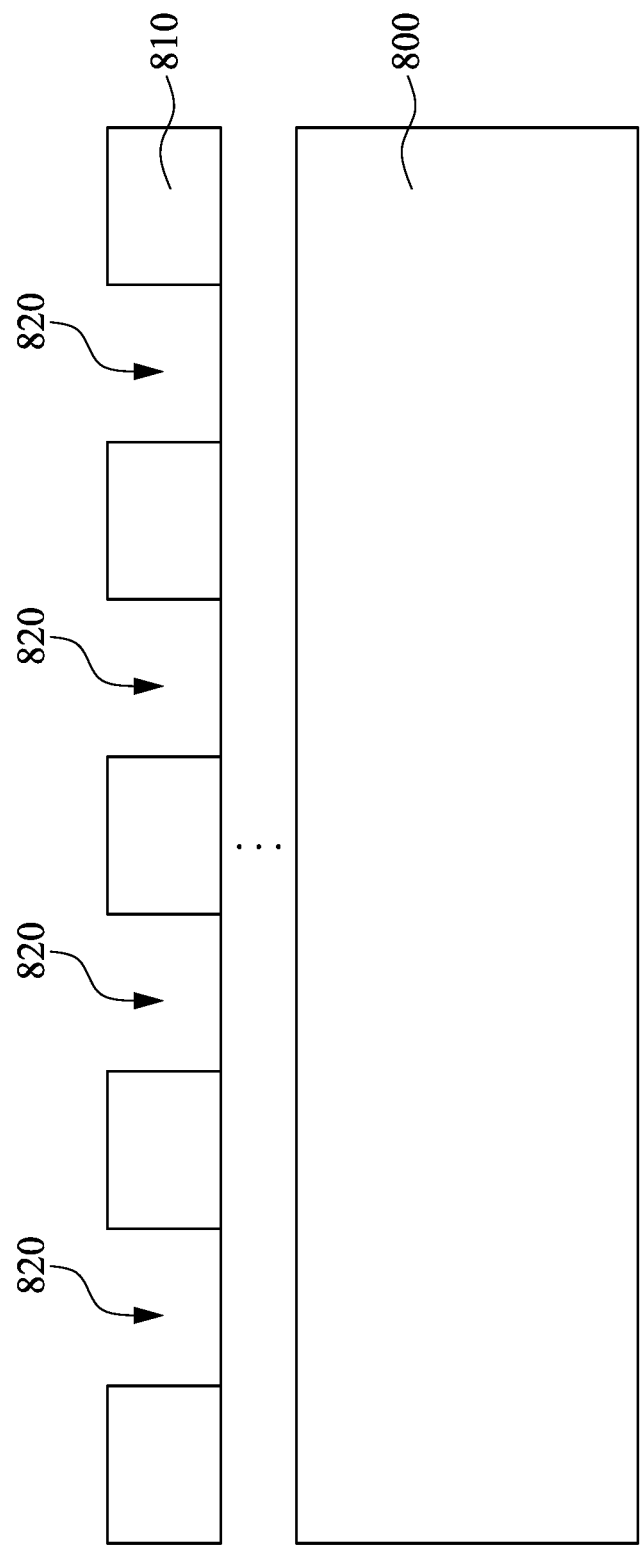

Reference is made to FIGS. 8A to 8F, which are cross-sectional views of the various stages of fabricating a semiconductor device according to some embodiments of the disclosure. As shown in FIG. 8A, a dielectric layer 810 is formed on a substrate 800. The substrate 800 can include an elementary semiconductor (e.g., silicon or germanium) and/or a compound semiconductor (e.g., silicon germanium, silicon carbide, gallium arsenic, indium arsenide, gallium nitride, or indium phosphide). The substrate 800 may include one or more doped regions. For example, a region of the substrate 800 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques. In some embodiments, the substrate 800 includes one or more active devices (not shown) formed on the substrate. Examples of such active devices include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, other suitable devices, and/or combinations thereof.

The dielectric layer 810 may include a semiconductor oxide, a semiconductor nitride, a semiconductor oxynitride, TEOS oxide, or other suitable materials. In some embodiments, the dielectric layer 810 includes one or more sub-layers such as an etch stop layer and/or a contact etch stop layer (CESL).

Referring to FIG. 8B, a patterning process is performed to pattern the dielectric layer 810, thereby forming a plurality of trenches 820 in the dielectric layer 810. In some embodiments, the number of the trenches 820 can be two or three. The top view of the trenches 820 can be spiral, quadrilateral, hexagonal, octagonal, or other polygonal in shape.

Referring to FIG. 8C, a filling layer 830 is deposited in the trenches 820 and on the dielectric layer 810. The filling layer 830 includes a conductive material, such as tungsten, copper, aluminum, aluminum/silicon/copper alloy, titanium, titanium nitride, tungsten nitride, metal silicide, combinations thereof, or another suitable conductive material.

Figure 8D:
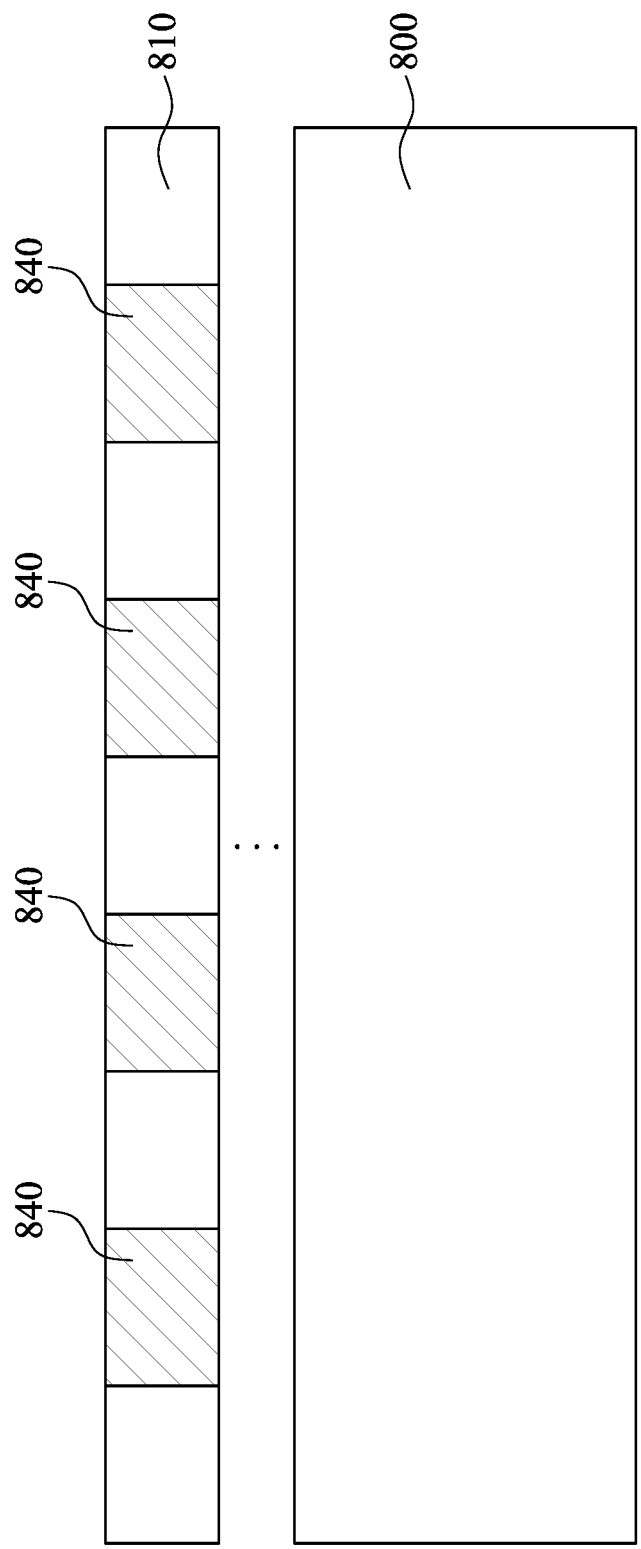

Referring to FIG. 8D, a planarization process is performed to expose the top surface of the dielectric layer 810, and the conductive material that remains is filled in the trenches 820 (as shown in FIG. 8C), and functions as electrodes 840 of the capacitor. In some embodiments, the electrodes 840 of the capacitor include a cathode and an anode, and the structure and dimensions thereof are similar to those discussed in FIGS. 1-4. In some other embodiments, the electrodes 840 of the capacitor include a cathode, an anode, and a common electrode, and the structure and dimensions thereof are similar to those discussed in FIGS. 1-4 and 6. In some embodiments, a combination of the electrodes 840 and the dielectric layer 810 can be referred to as a metal layer, and the electrodes 840 are the conductive lines in the metal layer.

Figure 8E:
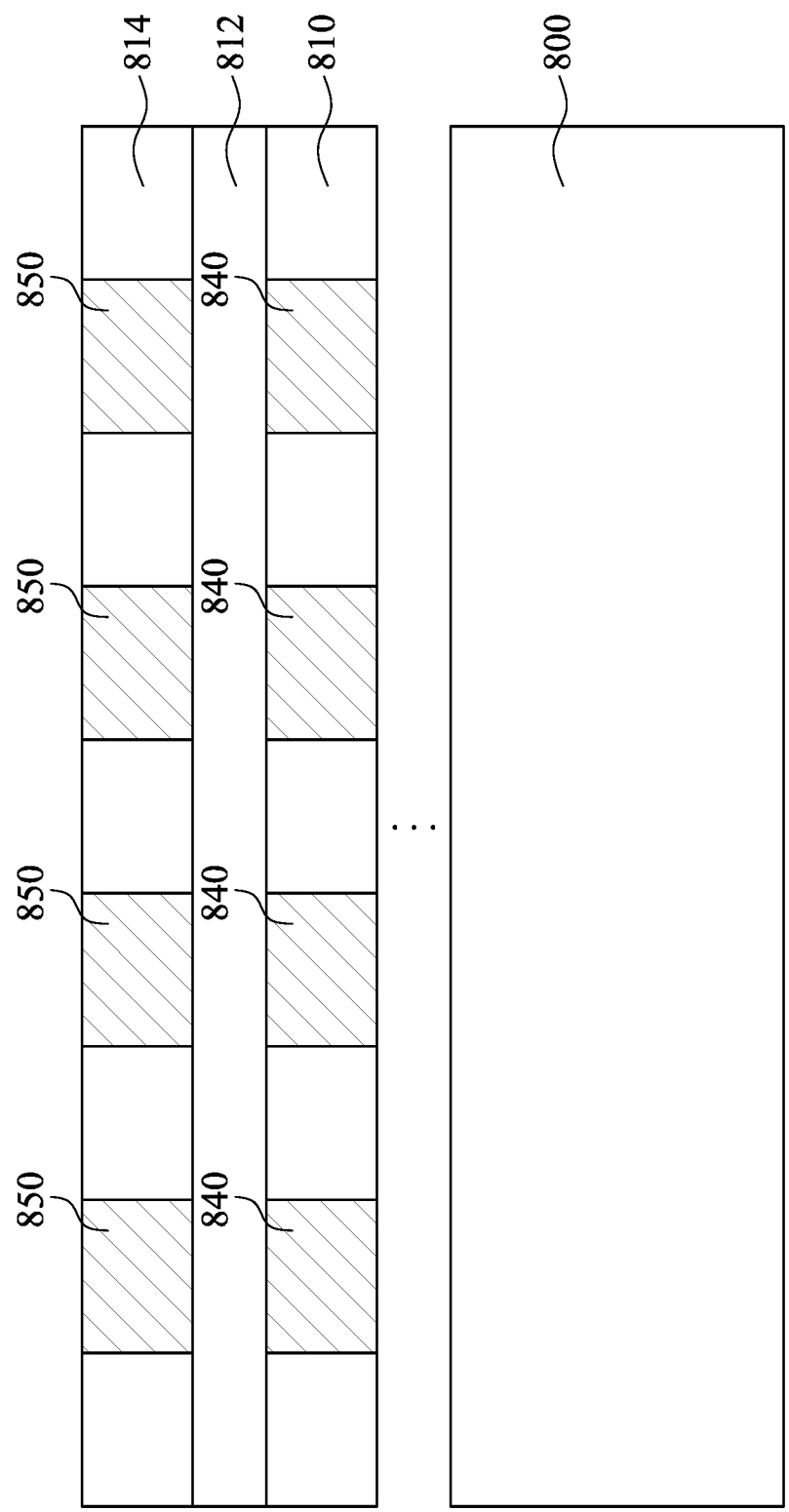

Referring to FIG. 8E, an additional metal layer including electrodes 850 and the dielectric layer 814 is formed over the metal layer including the electrodes 840 and the dielectric layer 810, and the metal layers are spaced by the dielectric layer 812 therebetween. The electrodes 850 are formed in the dielectric layer 814 and have similar patterns as that of the electrodes 840.

Figure 8F:
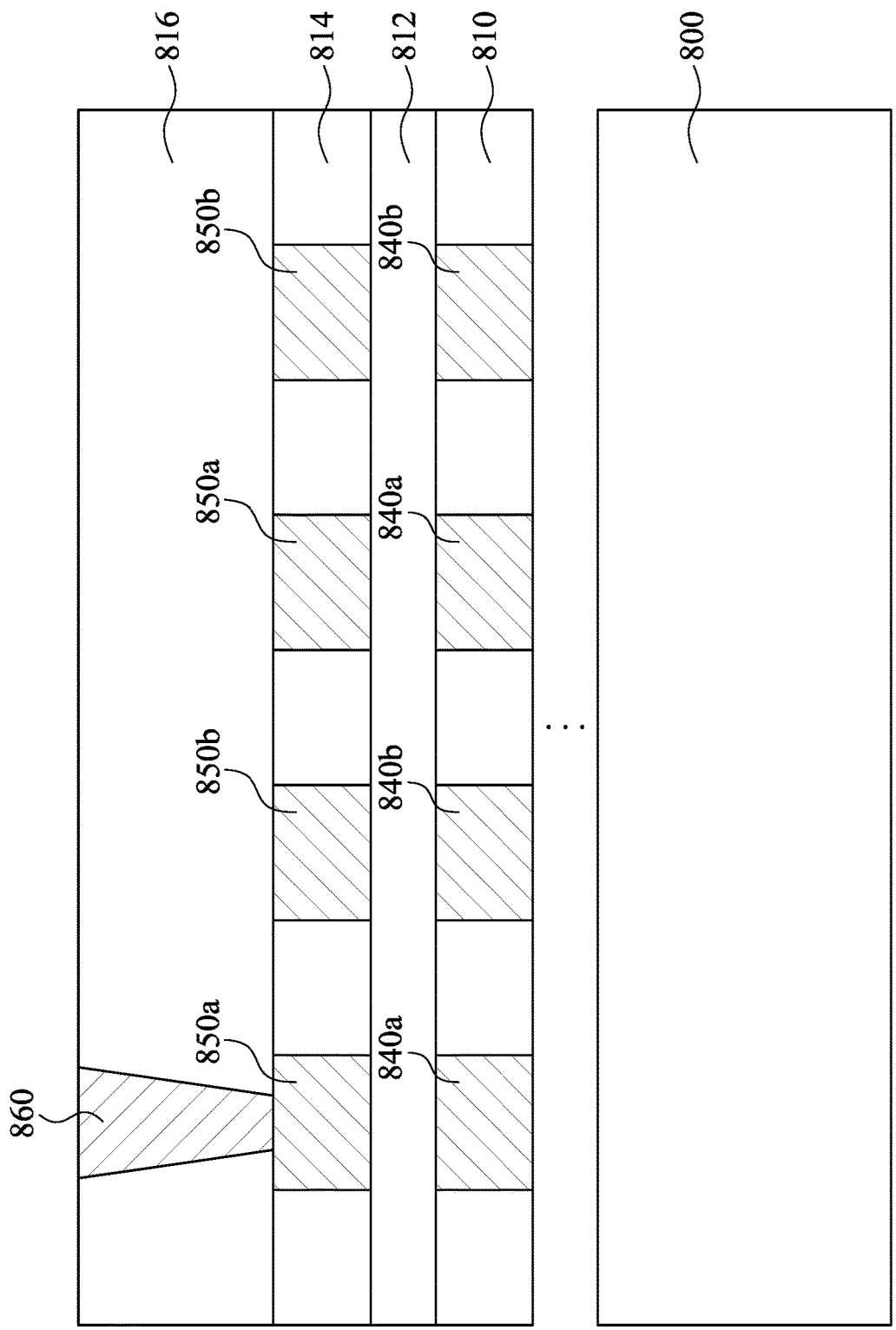

Referring to FIG. 8F, an interlayer dielectric layer 816 is formed on the electrodes 850 and the dielectric layer 814, and a plurality of vias 860 are formed penetrating the interlayer dielectric layer 816 to connect to the corresponding electrodes 850. In some embodiments, the electrodes 840 in the dielectric layer 810 includes a first anode 840a and a first cathode 840b, in which the first anode 840a spirally or polygonally extends outwards from a first end to a second end of the first anode 840a, and the first anode 840a and the first cathode 840b have a substantially equal spacing therebetween. The electrodes 850 in the dielectric layer 814 includes a second anode 850b and a second cathode 850a, in which the second anode 850b spirally or polygonally extends outwards from a first end to a second end of the second anode 850b, and the second anode 850b and the second cathode 850a have a substantially equal spacing therebetween. The second anode 850b overlaps the first cathode 840b to generate extra capacitance therebetween. The second cathode 850a overlaps the first anode 840a to generate extra capacitance therebetween.

According to some embodiments, the electrodes of the capacitor surround each other and are spaced apart by a consistent distance. The electrodes of the capacitors spirally or polygonally extend from a first end to a second end without any branch, such that the capacitance value of the capacitor can be increased.

According to some embodiments, a semiconductor device includes a capacitor. The capacitor includes a first electrode and a second electrode disposed in a first metal layer. The first electrode has a first end and a second end, and the first electrode has a spiral pattern extending outwards from the first end to the second end. The first electrode and the second electrode have a substantially equal spacing therebetween.

According to some embodiments, a semiconductor device includes a first electrode and a second electrode disposed in a metal layer. The first electrode has a first end and a second end. The first electrode has a plurality of turns and extends outwards from the first end to the second end. The first electrode includes a first portion extending longitudinally in a first direction, in a plane, and a second portion coplanar with the first portion in the plane and extending from the first portion in a second direction that is non co-linear with the first direction. The first electrode and the second electrode have a substantially equal spacing therebetween.

According to some embodiments, a method includes forming a first dielectric layer on a substrate, and a first anode and a first cathode are formed in the first dielectric layer, in which the first anode spirally or polygonally extends outwards from a first end to a second end of the first anode, and the first anode and the first cathode have a substantially equal spacing therebetween. A second dielectric layer is formed on the first dielectric layer. A second anode and a second cathode are formed in the second dielectric layer, in which the second anode spirally or polygonally extends outwards from a first end to a second end of the second anode, and the second anode and the second cathode have a substantially equal spacing therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first capacitor, comprising:
        a first electrode disposed in a first metal layer and having a first end and a second end, wherein the first electrode has a first spiral pattern extending outwards from the first end to the second end;
        a second electrode disposed in the first metal layer and having a third end, a fourth end, and a second spiral pattern extending outwards from the third end to the fourth end, wherein the first electrode and the second electrode have a substantially equal spacing therebetween; and
        a common electrode disposed in the first metal layer and having a fifth end, a sixth end, and a third spiral pattern extending outwards from the fifth end to the sixth end, wherein the fifth end of the common electrode is between the first end of the first electrode and the third end of the second electrode.

2. The semiconductor device of claim 1, wherein the first end of the first electrode and the third end of the second electrode face opposite directions.

3. The semiconductor device of claim 1, wherein the second end of the first electrode and the fourth end of the second electrode face opposite directions.

4. The semiconductor device of claim 1, wherein the first spiral pattern of the first electrode is a spiral of Archimedes.

5. The semiconductor device of claim 1, further comprising:
    a second capacitor, comprising:
        a third electrode disposed in a second metal layer, wherein the third electrode overlaps the first electrode; and
        a fourth electrode disposed in the second metal layer, wherein the fourth electrode overlaps the second electrode.

6. The semiconductor device of claim 5, further comprising a pair of shield plates, wherein the first capacitor and the second capacitor are disposed between the shield plates.

7. The semiconductor device of claim 1, wherein the common electrode is interposed between the first electrode and the second electrode.

8. The semiconductor device of claim 1, wherein the common electrode is a cathode, and the first electrode and the second electrode are anodes.

9. The semiconductor device of claim 1, wherein a first distance between the common electrode and the first electrode is equal to a second distance between the common electrode and the second electrode.

10. The semiconductor device of claim 1, wherein the first capacitor is a metal-oxide-metal capacitor.

11. A semiconductor device, comprising:
    a first electrode disposed in a first metal layer and having a first end and a second end, the first electrode having a plurality turns and extending outwards from the first end to the second end, the first electrode comprising:
        a first portion extending longitudinally in a first direction in a plane; and
        a second portion coplanar with the first portion in the plane and extending from the first portion in a second direction that is non co-linear with the first direction;
    a second electrode disposed in the first metal layer, wherein the first electrode and the second electrode have a substantially equal spacing therebetween;
    a plurality of first through vias on a next level above the first metal layer and electrically coupled to the first electrode; and
    a plurality of second through vias on the next level above the first metal layer and electrically coupled to the second electrode, wherein the plurality of first through vias and the plurality of second through vias define a via-free region larger than twice the spacing of the first and second electrodes.

12. The semiconductor device of claim 11, wherein the first electrode is free of a branch.

13. The semiconductor device of claim 11, wherein the second electrode is free of a branch.

14. The semiconductor device of claim 11, further comprising a third electrode disposed in the first metal layer and interposed between the first electrode and the second electrode.

15. The semiconductor device of claim 14, wherein the third electrode is free of a branch.

16. The semiconductor device of claim 11, wherein the semiconductor device is in a quadrilateral capacitor, a hexagonal capacitor, or an octagonal capacitor.

17. A method, comprising:
    forming a first dielectric layer on a substrate;
    forming a first electrode, a second electrode, and a first common electrode in the first dielectric layer, the first electrode having a first end, a second end, and a first spiral pattern extending outwards from the first end to the second end, the second electrode having a third end, a fourth end, and a second spiral pattern extending outwards from the third end to the fourth end, the first common electrode having a fifth end, a sixth end, and a third spiral pattern extending outwards from the fifth end to the sixth end, wherein the fifth end of the first common electrode is between the first end of the first electrode and the third end of the second electrode;
    forming a second dielectric layer on the first dielectric layer; and
    forming a third electrode and a fourth electrode in the second dielectric layer, wherein the third electrode spirally extends outwards from a seventh end to a eighth end of the third electrode, and the third electrode and the fourth electrode have a substantially equal spacing therebetween.

18. The method of claim 17, wherein the first common electrode is laterally interposed between the first electrode and the second electrode, the first common electrode is a cathode, and the first electrode and the second electrode are anodes.

19. The method of claim 17, further comprising:
    forming a second common electrode in the second dielectric layer and laterally interposed between the third electrode and the fourth electrode, wherein the second common electrode is a cathode, and the third electrode and the fourth electrode are anodes.

20. The method of claim 17, further comprising:
    forming a plurality of first through vias on a level above the first dielectric layer and electrically coupled to the first electrode; and forming a plurality of second through vias on the level above the first dielectric layer and electrically coupled to the second electrode, wherein the plurality of first through vias and the plurality of second through vias define a via-free region larger than twice the spacing of the first and second electrodes.

\* \* \* \* \*